United States Patent [19]

Neumark

[11] Patent Number: 4,904,618
[45] Date of Patent: Feb. 27, 1990

[54] PROCESS FOR DOPING CRYSTALS OF WIDE BAND GAP SEMICONDUCTORS

[76] Inventor: Gertrude F. Neumark, 153 Old Colony Rd., Hartsdale, N.Y. 10530

[21] Appl. No.: 234,802
[22] Filed: Aug. 22, 1988
[51] Int. Cl.$^4$ .......................................... H01L 21/368
[52] U.S. Cl. ..................................... 437/150; 437/81; 437/82; 437/965; 148/DIG. 41; 148/DIG. 64
[58] Field of Search ................... 437/150, 82, 905, 81, 437/144, 965, 945, 126, 127, 130, 971; 148/DIG. 64, DIG. 99, DIG. 101, DIG. 41; 357/308, 17

[56] References Cited

U.S. PATENT DOCUMENTS

| | | | |
|---|---|---|---|
| 3,578,507 | 5/1971 | Chang et al. | 437/965 |
| 4,105,478 | 8/1978 | Johnson | 437/91 |
| 4,422,888 | 12/1983 | Stutius | 437/81 |
| 4,526,632 | 7/1985 | Nishizawa et al. | 437/127 |
| 4,685,979 | 8/1987 | Nishizawa | 437/81 |
| 4,725,563 | 2/1988 | Nishizawa | 437/114 |
| 4,735,910 | 4/1988 | Mitsuju et al. | 437/126 |
| 4,755,856 | 7/1988 | Nishizawa | 437/130 |
| 4,783,426 | 11/1988 | Nishizawa | 437/81 |

OTHER PUBLICATIONS

"Li doped ZnSe and Problems of P-type Conduction", Neumark et al., Journal of Crystal Growth, vol. 59, pp. 189–195.

"Ionization Energy of the Shallow Nitrogen Acceptor in Zinc Selenide", Dean et al., Physical Review B, vol. 27, No. 4, pp. 2419–2428.

"Nitrogen as a Shallow Acceptor in ZnSe", by B. J. Fitzpatrick and P. M. Harnack, Extended Abstracts of the Electrochem. Soc. Mtg., vol. 81, (1981), pp. 408–409.

"Spectroscopic Studies of ZnSe Grown by Liquid Phase Epitaxy", B. J. Fitzpatrick et al., IEEE Transactions of Electron Devices, vol. Ed-28, No. 4, Apr. 1981, pp. 440–444.

D. G. Thomas et al., "Hydrogen as a Donor in Zinc Oxide", Dec. 1956, The Journal of Chemical Physics, vol. 25, No. 6, pp. 1136–1142.

R. J. Robinson et al., "p-n junction zinc sulfo-selenide and zinc selenide light-emitting diodes", Jul. 15, 1975, Applied Physics Letters, vol. 27, No. 2, pp. 74–76.

N. Magnea et al., "SEM and Photoluminescence Study of Li Segregation in Annealed Zinc Telluride", 1979, Solid State Communications, vol. 29, pp. 35–38.

Z. K. Kun, "The Variation of Residual Impurities in ZnSe Crystals Used in Light-Emitting Diode Fabrications", Feb. 1982, Journal of Applied Physics, vol. 53, No. 2, pp. 1248–1250.

G. F. Neumark et al., "Li Doped ZnSe and Problems of p-Type Conduction", 1982, Journal of Crystal Growth, vol. 59, pp. 189–195.

P. J. Dean et al., "Ionization Energy of the Shallow Nitrogen Acceptor in Zinc Selenide", Feb. 15, 1983, Physical Review B, vol. 27, No. 4, pp. 2419–2428.

C. Lee et al., "Low-Resistance Contacts to p-Type Li-Diffused CdTe", Dec. 1983, Journal of Applied Physics, vol. 54, No. 12, pp. 7041–7046.

A. Boudoukha et al, "Properties of Nitrogen Acceptor in CdTe: Energy Spectrum and Interaction", Journal of Crystal Growth, vol. 72, pp. 226–231.

J. Chevallier et al., Jul. 15, 1985, "Donor Neutralization in GaAs(Si) by Atomic Hydrogen", Applied Physics Letter, vol. 47, No. 2.

N. M. Johnson et al., "Interstitial Hydrogen and Neutralization of Shallow-Donor Impurities in Single-Crystal Silicon", Physical Review Letters, Feb. 17, 1986, vol. 56, No. 7, pp. 769–772.

S. J. Pearton et al., "Hydrogen in Crystalline Semiconductors", Applied Physics, 1987, vol. 43, pp. 153–195.

Primary Examiner—Brian E. Hearn
Assistant Examiner—Tuan Nguyen
Attorney, Agent, or Firm—Brumbaugh, Graves, Donohue & Raymond

[57] ABSTRACT

Non-equilibrium impurity incorporation is used to dope hard-to-dope crystals of wide band gap semiconductors, such as zinc selenide and zinc telluride. This involves incorporating into the crystal a compensating pair of primary and secondary dopants, thereby to increase the solubility of either dopant alone in the crystals. Thereafter, the secondary more mobile dopant is removed preferentially, leaving the primary dopant predominant. This technique is used to dope zinc selenide p-type by the use of nitrogen as the primary dopant and lithium as the secondary dopant.

5 Claims, 1 Drawing Sheet

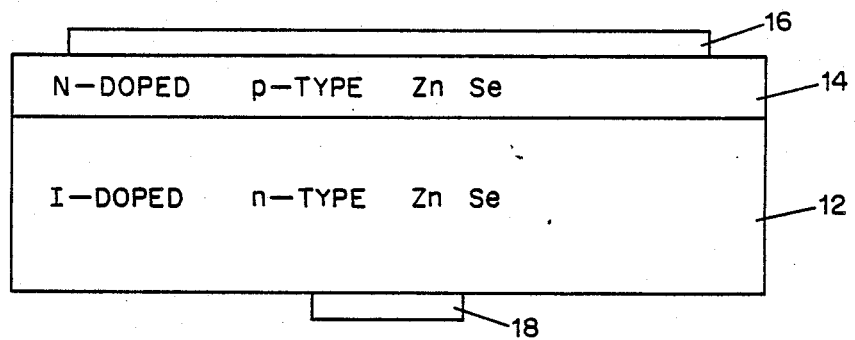

PROCESS FOR DOPING CRYSTALS OF WIDE BAND GAP SEMICONDUCTORS

BACKGROUND OF THE INVENTION

This invention relates to the preparation of crystals of wide band gap semiconductors for use in electronic devices.

As is known, crystals of semiconductors are of great interest in the manufacture of sophisticated electronic devices. The useful properties of semiconductive crystals depend not only on the particular semiconductor that forms the crystal but also importantly on the trace amounts of donor or acceptor dopants that are incorporated in the crystal lattice. These dopants contribute the hole and electron charge carriers that are responsible for the useful electronic properties of the crystals.

With many potentially useful semiconductive crystals, particularly those in which the host material is a wide band-gap semiconductor (a band gap of at least 1.4 electron volts), such as zinc selenide, it has been difficult to incorporate into the crystal lattice in reproducible fashion adequate amounts of both types of dopant to provide good p-n junctions, i.e., both n-type and p-type conductivity. As a consequence, it has not been practical to use such semiconductors widely in devices where bipolar conductivity is important.

In particular, although n-type zinc selenide has been available which conducts "well" (defined as having a resistivity equal to or less than $10^3$ ohm-centimeter), this has not been the case with p-type zinc selenide. The standard practice for preparing "well-conducting" n-type zinc selenide involves the extraction of impurities, such as copper, by annealing. Such annealing is known to extract copper that is accidentally introduced during the preparation of bulk material.

More recently n-type zinc selenide has been prepared using low temperature growth methods, such as metal-organo-chemical vapor deposition (MOCVD) and molecular beam epitaxy (MBE) with selective incorporation of appropriate dopants.

However, with respect to p-type zinc selenide, it has been difficult to obtain "well-conducting" material reliably in reproducible fashion. There have been recent claims that such material has been realized by the introduction of $Li_3N$. Others have claimed to have obtained it by the introduction of gallium, indium or thallium by heat treatment and diffusion. However, the understanding of these techniques has been poor with the result that there is little confidence in applying these techniques to commercial products.

There is needed a better-understood technique, amenable to good control, for doping hard-to-dope wide band gap semiconductors, such as zinc selenide, zinc sulphide, cadmium sulphide, cadmium selenide, zinc telluride and diamond.

SUMMARY OF THE INVENTION

I believe that energy and solubility considerations form the basic difficulty in incorporating particular dopants into crystals of the kind under discussion. Such considerations predict a strong tendency for compensation between donors and acceptors in wide band gap materials. Accordingly, the achievement of adequate conductivity will require "non-equilibrium impurity incorporation". This term means the incorporation of a dopant (impurity) in excess of its equilibrium solubility at a particular temperature and concentration of compensating species. As is also known, the solubility of a donor or an acceptor at a given temperature will increase with an increase in concentration of compensating species so that, in effect, compensation increases the solubility of a dopant.

Moreover to be of practical use, such nonequilibrium incorporation needs to persist over reasonable time scales at operating temperatures, so that the mobility of the desired dopant needs be low enough that the dopant remains locked in the crystal lattice after the initial non-equilibrium incorporation.

Various techniques are feasible for achieving non-equilibrium incorporation. The simplest is to introduce the desired dopant species at a temperature where its mobility and solubility is high, with subsequent fast quenching to a lower temperature where the mobility is low, to lock the dopant in the lattice. A variant of this has been suggested in which the preferred site of an amphoteric dopant can be a function of temperature. However, these techniques for achieving a non-equilibrium concentration have been of limited usefulness, particularly with respect to wide-band gap materials that are difficult to make "well-conducting."

A feature of the present invention is an approach to achieving a non-equilibrium concentration that uses consciously, with optimum parameters, phenomena that may have been accidentally involved in the past. In my new technique, a desired primary dopant species is introduced into the semiconductor of interest together with a concentration, preferably nearly the same, of a suitable secondary compensating species, advantageously one more mobile at lower temperatures. The compensating species acts to increase the solubility of the desired dopant so that the concentration introduced of the desired dopant may be larger than the equilibrium value in the absence of the compensating species. Subsequently, in disciplined fashion, the more mobile compensating species is preferentially removed. Introduction of a chosen mobile compensating species, of a concentration closely matching that of the desired dopant, will prevent or reduce the incorporation o other, possibly less mobile compensating species. In this case, after the removal of the selected mobile compensating species, the dopant remaining in the host crystal will be predominantly only the desired dopant whereby the material may be of high conductivity of the type imparted by the desired dopant.

In an illustrative example of a process, in accordance with my inventions, a layer of zinc selenide is doped p-type with nitrogen by liquid phase epitaxial (LPE) growth from a lithium-rich melt. The doping with nitrogen may be achieved by using ammonia ($NH_3$) essentially in the manner described in a paper entitled "Ionization energy of the shallow nitrogen acceptor in zinc selenide" published in Physical Review B, Vol. 27, Number 4, 15 February 1983, pps. 2419–2428. In the resulting layer, nitrogen is substituted in selenium sites as an acceptor, and lithium is incorporated in interstitial sites where it acts as a donor. Subsequent to its growth, the layer is heated to a temperature of about 900° C. in zinc vapor together with indium, gallium or thallium vapor. This heating tends to getter the faster diffusing lithium selectively from the layer whereby it is left doped primarily by nitrogen and so is of high conductivity p-type.

If a p-n junction is to be formed, an n-type zinc selenide crystal is used as the substrate in the LPE process which the lithium-nitrogen epitaxial layer is grown. Advantageously the crystal used as the substrate is n-type by the inclusion, as the predominant dopant, of a donor, such as iodine, that diffuses only slowly in the zinc selenide, so that little of it is lost during the lithium gettering step.

DESCRIPTION OF THE DRAWING

The invention will be described in conjunction with the accompanying drawing that shows a p-n diode of Zn Se made in accordance with an illustrative embodiment of the invention.

DETAILED DESCRIPTION OF THE INVENTION

A p-n junction zinc selenide diode 10 including layers 12 and 14, suitable for use as a light-emitting diode, shown in the drawing, is prepared as follows.

There is first prepared the n-type slice 12 of zinc selenide in known fashion, for example, as described in a paper entitled "p-n junction zinc sulfo-selenide and zinc selenide light-emitting diodes" Applied Physics Letters, Vol. 27 No. 2, 15 July 1975 pps. 74–77. This involves preparing a single crystal boule of n-type zinc selenide by an iodine transport technique, cutting a slice parallel to the (111) plane, and annealing the slice in molten zinc. The resulting material is made to have a resistivity of the order of 0.1 ohm-cm., corresponding to an iodine concentration of between $10^{17}$ and $10^{18}$ per $cc^3$. The slice desirably is about 1 mm. thick and 0.5 cm radius.

Thereafter, there is grown on one surface of the n-type slice 12, an epitaxial p-type layer 14, typically between 5 and 10 microns thick, although even thinner layers can be used. This layer advantageously is grown by LPE to include both lithium and nitrogen in appropriate amounts in the manner described previously with reference to the Physical Review B paper. The amounts added are best determined experimentally but should be adequate to provide, in the epitaxial layer grown, substantially equal concentrations of lithium and nitrogen, advantageously in the range between $10^{17}$ and $10^{18}$ per $cc^3$. As long as the amounts of each in the melt are approximately equal, because of strong compensating effects in such wide band gap crystals, substantially equal amounts of the two dopants will be introduced into the crystal. Because the presence of the lithium increases the effective solubility of the nitrogen, there can be introduced into the zinc selenide a normally non-equilibrium concentration, as previously discussed.

Then, in known fashion, the lithium is preferentially removed from the epitaxial layer. This is feasible because of the much lower mobility of nitrogen and iodine in zinc selenide in this temperature range. There results a p-type epitaxial layer with a nitrogen concentration of about $10^{17}$ per $cc^3$. A suitable procedure is to heat the slice in the range of between 600° C.–1000° C. in zinc vapor together with either indium, gallium, or thallium as suggested in a paper entitled "The variation of residual impurities in Zn Se crystals used in light-emitting diode fabrications", J. Appl. Phys. 53(2) February 1982, pps. 1248–1250.

To complete the diode, a thin layer 16 of gold is deposited over the p-type layer to serve as one of the two electrodes of the diode. A dot 18 of indium is deposited over the bottom surface of the slice to serve as the other electrode of the diode. This leaves a considerable portion of the bottom surface free for the exit of the emitted light excited when an appropriate voltage is applied between the two electrodes. Such a diode emits blue light of about 460 μm wavelength.

Of course, other electrode configurations are possible, including ring-shaped electrodes, to facilitate the exit of the emitted light.

Additionally, the principles of the invention are applicable to the preparation of devices using wide band gap semiconductors other than zinc selenide.

A light-emitting p-n junction diode can be formed in zinc telluride in accordance with an alternative embodiment of the invention as follows.

A p-type crystal of ZnTe was grown from a Te rich solution by a Bridgman technique, as discussed in a paper entitled "SEM and Photoluminescence Study of Li Segregation in Annealed Zinc Telluride" published in Solid State Communications Vol. 29, pps. 35–38, Pergamon Press Ltd. 1979.

Then in known fashion, using metal-organo-chemical vapor deposition (MOCVD), an n-type epitaxial layer is grown on the top surface of the slice. In this case, the epitaxial layer is doped with chlorine as the primary dopant and lithium as the compensating or secondary dopant. Chlorine is a donor in zinc telluride at a tellurium substitutional site while lithium acts as an acceptor on a zinc substitutional site. Moreover, because of its larger ionic size, chlorine will be less mobile than will the lithium.

As before, the presence of the lithium will permit the introduction into the epitaxial layer of a higher concentration of the chlorine than normally possible, as discussed above, by increasing its effective solubility. Again, the amounts of each introduced into the epitaxial layer are made to be about equal.

Then, the zinc telluride slice is heated in a zinc atmosphere to remove the more mobile lithium preferentially as, for example, is reported in a paper entitled "SEM and Photoluminescence Study of Li Segregation in Annealed Zinc Telluride", Solid State Communications, Vol. 29, pps. 35–38, Pergamon Press Ltd. 1979. Accordingly, chlorine becomes the predominant dopant in the epitaxial layer, whereby it becomes n-type. As before appropriate electrodes are provided to the opposite surfaces of the slice to form the diode.

It should be evident that the basic principles described can be extended to various other systems of wide band gap materials and should be of special interest to materials that are normally difficult to dope adequately.

Basically, as described by choosing an appropriate compensating pair of primary and secondary dopants, the amounts introduced of each into a crystal may be larger than their solubilities in the crystal normally permits alone. Thereafter by the removal preferentially of the secondary dopant, typically by taking advantage of its higher mobility in the crystal, the crystal is left with a higher non-equilibrium concentration of the primary dopant. Copper, gold and hydrogen are other examples of likely choices for use as the secondary dopant.

It should also be apparent that the invention should make feasible the formation of various other forms of electronic devices, such as transistors and injection lasers.

Additionally, while there have been described embodiments using LPE and MOCVD for forming layers including compensating pairs of primary and secondary dopants, other techniques are feasible including molecular beam epitaxy (MBE).

Reference is made to my copending application filed Aug. 15, 1988, Ser. No. 232,405. This discusses the use of hydrogen as secondary dopant, for instance to facilitate the substitution of nitrogen in selenium sites in zinc selenide and then removing the hydrogen to leave the nitrogen predominant to serve as an acceptor for doping the zinc selenide p-type.

I claim:

1. A process for the non-equilibrium incorporation of a dopant into a crystal of a wide band gap semiconductor comprising the steps of treating the crystal in the presence of first and second compensating dopants of different mobilities for introducing substantially equal amounts of the two dopants into at least a portion of the crystal such that the concentration of the less mobile of the two dopants in said portion of the crystal is in excess of the solubility therein of the less mobile dopant in the absence of the more mobile of the two dopants, and then heating the crystal to remove therefrom preferentially the more mobile of the two dopants whereby there is left a non-equilibrium concentration of the less mobile dopant in said portion of the crystal.

2. The process of claim 1 in which the semiconductor is zinc selenide and the more mobile dopant is lithium and the less mobile dopant is nitrogen.

3. The process of claim 1 in which the semiconductor is zinc telluride and the more mobile dopant is lithium and the less mobile dopant is chlorine.

4. The process of claim 1 in which the more mobile dopant can move via interstitial sites and the less mobile dopant is at a substantial site in the crystal.

5. The process of forming a p-n junction diode in a crystal of a wide band gap semiconductor comprising the steps of preparing a crystal of the semiconductor of one conductivity type and growing on a surface of the crystal an epitaxial layer that includes a compensating pair of primary and secondary dopants in substantially equal amounts, such that the concentration of the primary dopant in the layer is in excess of the solubility of the primary dopant in the layer in the absence of the secondary dopant, where the primary dopant is characteristic of the conductivity type opposite that of said crystal and is less mobile than the secondary dopant, and removing selectively the secondary dopant from the layer to leave it of the opposite conductivity type, where the dopant remaining in the layer is predominantly the primary dopant in a non-equilibrium concentration.

* * * * *

UNITED STATES PATENT AND TRADEMARK OFFICE
CERTIFICATE OF CORRECTION

PATENT NO.    : 4,904,618

DATED         : Feb. 27, 1990

INVENTOR(S)   : Gertrude F. Neumark

It is certified that error appears in the above-identified patent and that said Letters Patent is hereby corrected as shown below:

First page, the first two "OTHER PUBLICATIONS" are incomplete duplications of two references listed properly in the second column; line 6 of Abstract, "crystals" should read -- crystal --. Col. 2, line 42, "o other" should read -- of other --. Col. 6, line 9, "substantial" should read -- substitutional --, per claim 4, line 3.

Signed and Sealed this

Twenty-fifth Day of June, 1991

Attest:

HARRY F. MANBECK, JR.

*Attesting Officer*

*Commissioner of Patents and Trademarks*